(12) United States Patent
Wang et al.

(10) Patent No.: US 6,496,078 B1
(45) Date of Patent: Dec. 17, 2002

(54) ACTIVATING ON-CHIP OSCILLATOR USING RING OSCILLATOR

(75) Inventors: Sheng Hung Wang, San Diego, CA (US); Simon S. Kim, Vista, CA (US)

(73) Assignees: Sony Corporation, Tokyo (JP); Sony Electronics Inc., ParkRidge, NJ (US)

( * ) Notice: Subject to any disclaimer, the term of this patent is extended or adjusted under 35 U.S.C. 154(b) by 0 days.

(21) Appl. No.: 09/652,394

(22) Filed: Aug. 31, 2000

(51) Int. Cl.[7] .................................................. H03L 3/00

(52) U.S. Cl. ........................... 331/172; 331/46; 331/57; 331/1 A; 327/291

(58) Field of Search .......................... 331/1 A, 46, 172, 331/57; 327/291

(56) References Cited

U.S. PATENT DOCUMENTS 5,257,294 A * 10/1993 Pinto et al. .................. 331/1 A
5,623,234 A    4/1997 Shaik et al. .................... 331/49

* cited by examiner

*Primary Examiner*—Arnold Kinkead
(74) *Attorney, Agent, or Firm*—Blakely, Sokoloff, Taylor & Zafman LLP

(57) ABSTRACT

In one embodiment of the present invention, an oscillator activator includes a trigger circuit, a controller, and a stability generator. The trigger circuit generates a trigger signal based on a reset signal. The controller controls generation of an oscillator signal from a main oscillator based on the reset signal. The stability generator generates a stability indicator signal in response to the trigger signal. The stability indicator signal indicates a stable condition of the main oscillator corresponding to a start-up time of the main oscillator.

27 Claims, 3 Drawing Sheets

ACTIVATING ON-CHIP OSCILLATOR USING RING OSCILLATOR

BACKGROUND

1. Field of the Invention

This invention relates to digital logic circuits. In particular, the invention relates to oscillator control.

2. Description of Related Art

Oscillators are important elements in digital circuit design because they are the main source of providing clock signals. In Application Specific Integrated Circuit (ASIC) design, the behavior of an on-chip oscillator affects device performance significantly.

An oscillator typically requires a warm-up or start-up time interval when power is first applied in order to reach a stable state. During this stable state the oscillator can provide a stable clock source. If the power is at the same time applied to other circuit elements which rely on the oscillator for performing their operations, an unstable clock signal from the oscillator may lead to incorrect operations. In addition to the power-on reset problem, when an oscillator is temporarily put in a standby or power down mode and subsequently is restored to an operational state, e.g., a wake-up sequence, the restoration process may similarly generate unwanted oscillator's instability.

One approach to solve this problem includes using a power-on reset circuitry which generates a reset signal long enough to ensure stability has been reached. This technique would still require some way to detect a stable oscillator output. Traditional techniques for detecting a stable oscillator use an analog phase-locked loop (PLL) circuit. However, this technique adds complexity, extra hardware (e.g., extra input/output pins), silicon area, and power consumption.

Therefore, there is a need to have a technique to control an oscillator in an efficient and flexible manner.

SUMMARY

The present invention is a method and apparatus to control activation of an oscillator. In one embodiment of the present invention, an oscillator activator includes a trigger circuit, a controller, and a stability generator. The trigger circuit generates a trigger signal based on a reset signal. The controller controls generation of an oscillator signal from a main oscillator based on the reset signal. The stability generator generates a stability indicator signal in response to the trigger signal. The stability indicator signal indicates a stable condition of the main oscillator corresponding to a start-up time of the main oscillator.

BRIEF DESCRIPTION OF THE DRAWINGS

The features and advantages of the present invention will become apparent from the following detailed description of the present invention in which.

DESCRIPTION

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Figure 1:
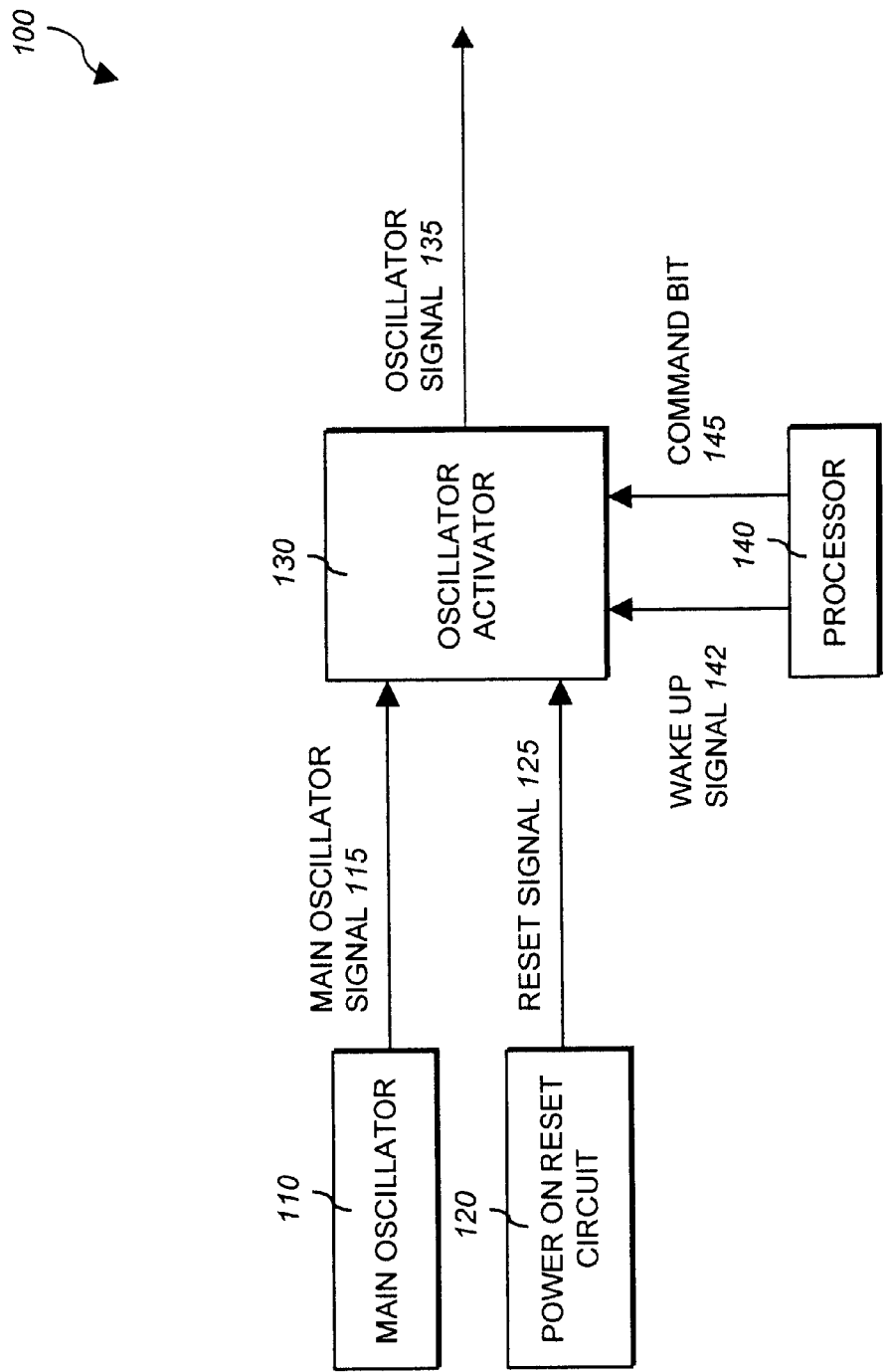
FIG. 1 is a diagram illustrating a system in which one embodiment of the invention can be practiced.

FIG. 1 is a diagram illustrating a system 100 in which one embodiment of the invention can be practiced. The system 100 includes a main oscillator 110, a power-on reset circuit 120, an oscillator activator 130, and a processor 140.

The main oscillator 110 is a device that generates a main oscillator signal 115 at a specified frequency. The main oscillator signal 115 is a clock signal which is used to provide the basic timing reference for other circuits in the system 100. When power is first applied, the main oscillator 110 goes through a start-up, or warm-up, time interval. During this start-up time, the main oscillator clock signal 115 may be unstable. For example, the signal waveform may not have the proper frequency and duty cycle, or the magnitude may not be at the proper logic levels. If the main oscillator signal 115 is used by other circuit elements during this start-up time, they may not function properly.

The power-on reset circuit 120 is a circuit that generates a reset signal 125 to other circuit elements in the system 100 when power is first turned on. The power-on reset circuit 120 ensures that power is fully energized at its operating range. In one embodiment, the reset signal 125 is asserted LOW during the power-on reset time. When power reaches its normal operating range, e.g., 5V, the reset signal 125 is then de-asserted HIGH. The relationship between the power-on reset time and the start-up time of the main oscillator 110 is important to ensure a proper initialization of the circuit elements in the system 100. If the start-up time is smaller than the power-on reset time, then the oscillator signal 115 is stable before other circuit elements begin their operation. However, if the power-on reset time is smaller than the start-up time, then when the circuit elements are fully powered and ready to function using the main oscillator signal 115, they may not function properly due to the unstable condition of the main oscillator signal 115.

The oscillator activator 130 is a circuit to control the generation an oscillator signal 135 that is guaranteed to be stable. The oscillator signal 135 is essentially the main oscillator signal 115 that is generated when the main oscillator 110 has reached its stable condition, e.g., when the start-up time has been reached.

The processor 140 is a device that controls the operation of the oscillator activator 130. The processor 140 sends a command bit 145 to the oscillator activator 130. During initialization or power-on reset, the control signal 235 is asserted HIGH. After the main oscillator 110 reaches its stable state, the command bit 145 is de-asserted LOW. The wake-up signal 147 is typically provided by an external wake-up event. In addition, the processor 140 may also generate a wake-up signal 147 to the oscillator activator 130 to start a wake-up sequence. A wake-up sequence is an event that restores the oscillator signal after a power-down, standby, or sleep mode.

Figure 2:
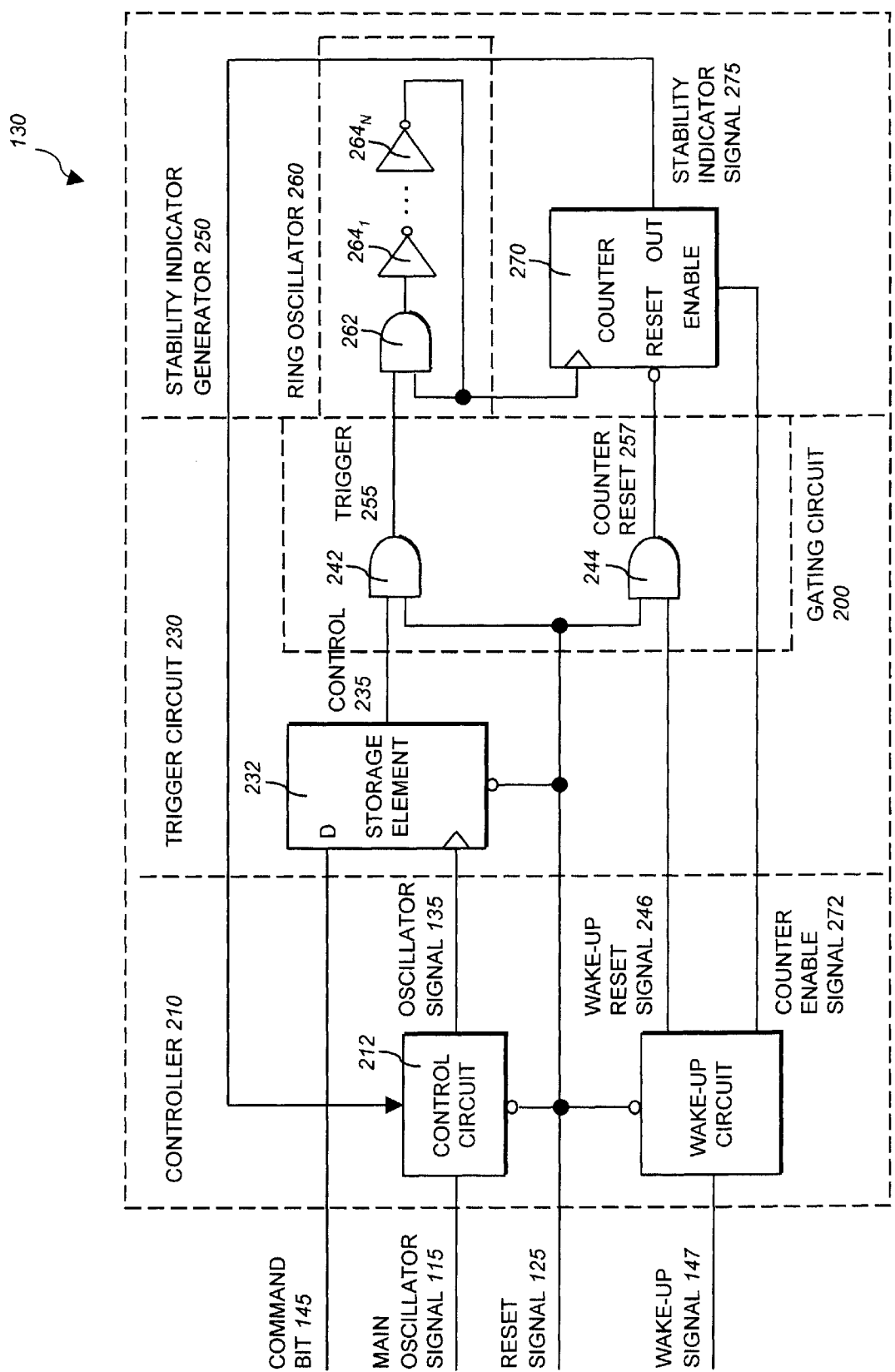
FIG. 2 is a diagram illustrating an oscillator activator circuit shown in FIG. 1 according to one embodiment of the invention.

FIG. 2 is a diagram illustrating the oscillator activator 130 shown in FIG. 1 according to one embodiment of the invention. The oscillator activator 130 includes a controller 210, a trigger circuit 230, and a stability indicator generator 250.

The controller 210 receives the main oscillator signal 115 from the main oscillator 110, the reset signal 125 from the power-on reset circuit 120, the wake-up signal 147 from the processor 140 (FIG. 1), and a stability indicator signal 275 from the stability indicator generator 250. The controller 210 generates the oscillator signal 135 to the trigger circuit 230. The oscillator signal 135 is essentially the main oscillator signal 115 at its stable condition, e.g., when the start-up time has expired.

The controller 210 includes a control circuit 212 and a wake-up circuit 218. The control circuit 212 generates the oscillator signal 135 from the main oscillator 110 upon receiving the stability indicator signal 275. The oscillator signal 135 is reset by the reset signal 125. In one embodiment, the control circuit 212 includes a flip-flop and a gating circuit. The flip-flop has an asynchronous clear and preset inputs. The output of the flip-flop is used to gate the main oscillator signal 115. The reset signal 125 is used to asynchronously clear the flip-flop during power-on reset. The stability indicator signal 275 is used to asynchronously preset the flip-flop. When the start-up time has expired as indicated by an active HIGH state of the stability indicator signal and the inactive HIGH state of the reset signal 125, the flip-flop generates a stable HIGH output which gates the main oscillator signal 115 to become the oscillator signal 135. The wake-up circuit 218 generates a wake-up reset signal 246 to the trigger circuit 230 and a counter enable signal 272 to the stability indicator generator 250. During power on reset, the wake-up reset signal 246 is de-asserted HIGH. The counter enable signal 272 enables the stability generator upon receiving the wake-up signal 147. The wake-up circuit 218 is also reset by the reset signal 125.

The trigger circuit 230 generates a trigger signal 255 based on the reset signal 125. The trigger circuit 230 includes a storage element 232 and a gating circuit 240. The storage element 232 generates a control signal 235. The storage element 232 is reset upon receiving the reset signal 125. In one embodiment, the storage element 232 is a flip-flop clocked by the oscillator signal 135. During power-on reset, the flip-flop 232 is reset and the control signal 235 is reset to LOW. During normal mode, the flip-flop 232 clocked the command bit 145 from the processor 140. The control signal 235 is then the same as the command bit 145. The gating circuit 240 gates the control signal 235 with the reset signal 125. The gated control signal becomes the trigger signal 255. During power-on reset, the trigger signal 255 is de-asserted LOW which initializes the stability indicator generator 250. The gating circuit 240 also generates a counter reset signal 257 to the stability indicator generator 250. In one embodiment, the gating circuit 240 includes AND gates 242 and 244. The AND gate 242 ANDs the control signal 235 and the reset signal 125 t generate the trigger signal 255. The AND gate 244 ANDs the wake-up reset signal 246 and the reset signal 125 to generate the counter reset signal 257.

The stability indicator generator 250 generates the stability indicator signal 275 in response to the trigger signal 255. The stability indicator signal 275 indicates a stable condition of the main oscillator 110 which corresponds to the start-up time of the main oscillator 100. The stability indicator generator 250 includes a ring oscillator 260 and a counter 270.

The ring oscillator 260 essentially is a free-running oscillator using a regenerative process of a ring of logic elements. The ring oscillator 260 generates a ring oscillator signal 268 upon receiving the trigger signal 255. In one embodiment, the ring oscillator 260 includes a ring of circularly connected logic elements to generate the ring oscillator signal 268. In one embodiment, the ring oscillator 260 includes an AND gate 262 followed by N inverters $264_1$ to $264_N$ connected in cascade where the last inverter $264_N$ has its output connected in a feedback path to the input of the AND gate 262. The ring oscillator signal 268 has a frequency range according to the operating conditions such as environmental conditions. During power on reset, the trigger circuit 230 de-asserts the trigger signal 255 at LOW level because the reset signal 125 is asserted LOW and the control signal 235 is HIGH. The LOW trigger signal 255 breaks the feedback loop of the ring oscillator to allow each of the inverters $264_1$, to $264_N$ to settle to a known state (e.g., 0, 1, . . . sequence). When the reset signal 125 is de-asserted HIGH, the trigger signal 255 is asserted HIGH which starts the ring oscillator 260 to oscillate.

The counter 270 is a normal counter which is clocked by the ring oscillator signal 268 from the ring oscillator 260. The counter 270 is initially reset during power on reset by the counter reset signal 257. The counter 270 starts counting when the reset signal 125 is de-asserted HIGH. The counter 270 generates the stability indicator signal 275 when a maximum count is reached. The maximum count is selected to correspond to the start-up time of the main oscillator 110. In addition, the counter 270 is further reset by the wake-up circuit 218 via the wake-up reset signal 246.

The selection of the maximum count for the counter 270 depends on the start-up time of the oscillator 110. The following example illustrates how this maximum count can be selected.

Suppose the start-up time of 10 milliseconds (ms) is desired for the main oscillator 110. Over an operating range of temperature from −40° C. to +125° C., a typical inverter delay ranges from 0.1 nanosecond (ns) to 0.2 ns. Suppose the AND gate delay is also 0.1 ns to 0.2 ns. Suppose further that the number of inverters in the ring oscillator is N=127, then the range of frequencies of the ring oscillator signal 268 is:

At−40° C.: 127×(0.1+0.1)+0.1=25.5 ns→39.2 MHz

At+125° C.: 127×(0.2+0.2)+0.2=51 ns→19.6 MHz

To guarantee a minimum start-up time of 10 ms, the fastest frequency is used to calculate the maximum count for the counter 270. Using the value 39.2 MHz, a 10 ms-period requires 10 ms/25.5 ns=392,156 clocks. A 19-bit counter can therefore be used, which may result in a maximum count of 524,288.

Figure 3:
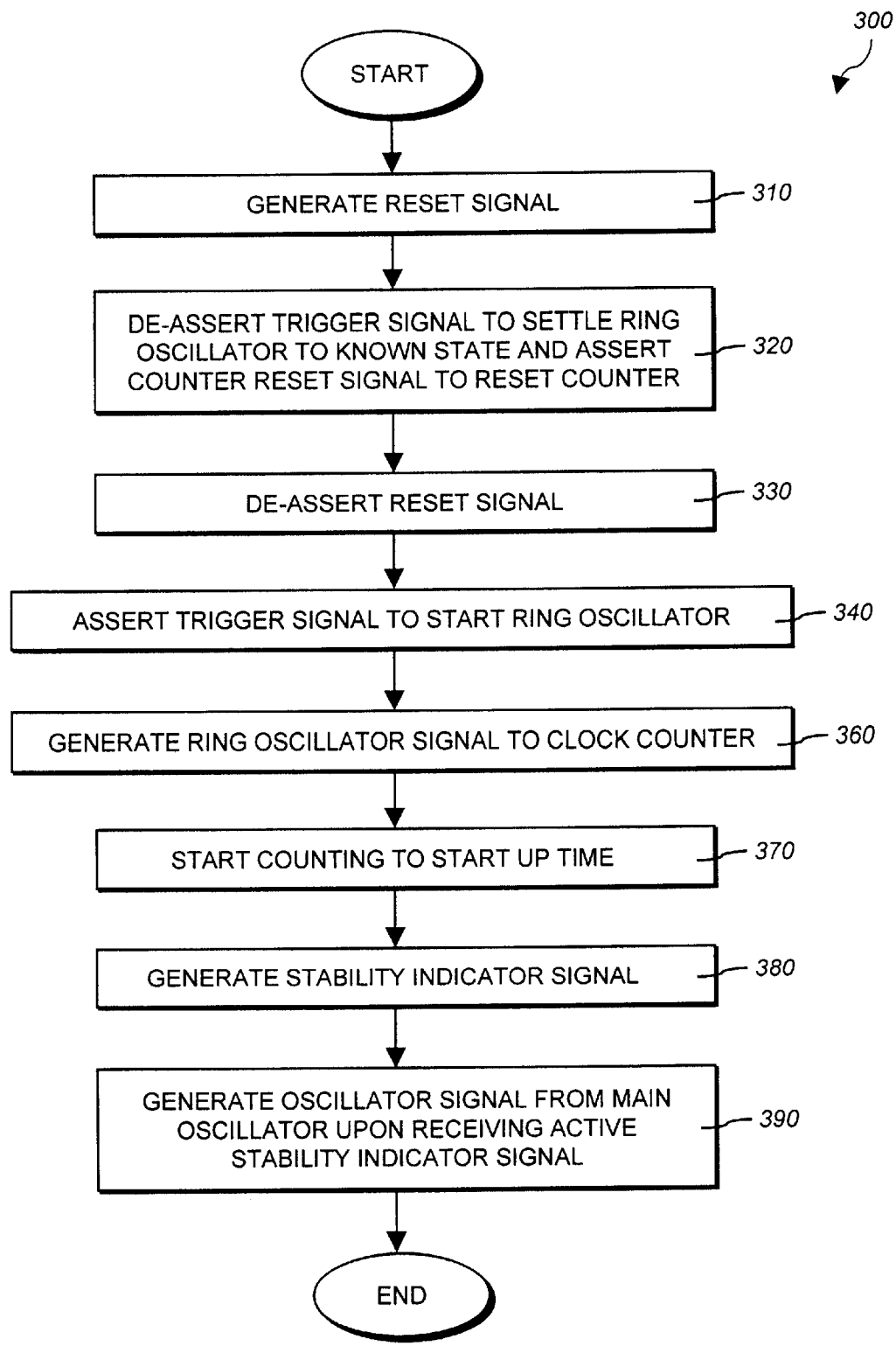
FIG. 3 is a flowchart illustrating a process to activate the main oscillator according to one embodiment of the invention.

FIG. 3 is a flowchart illustrating a process 300 to activate the main oscillator according to one embodiment of the invention.

Upon START, the process 300 generates a reset signal (Block 310). Then, the process 300 de-asserts the trigger signal to settle the ring oscillator to a known state and asserts the counter reset signal to reset the counter (Block 320). Next, the process 300 de-asserts the reset signal (Block 330). This will also remove the counter from the reset state and ready to count as soon as the clock signal is provided. Then, the process 300 asserts the trigger signal to start the ring oscillator (Block 340).

Next, the process 300 generates the ring oscillator signal to clock the counter (Block 360). The process 300 then starts counting up to the maximum count corresponding to the start-up time (Block 370). When the maximum count is reached, the process 300 asserts the stability indicator signal (Block 380). Then, the process 300 generates the oscillator signal from the main oscillator upon receiving the active stability indicator signal (Block 390). The process 300 is then terminated.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
    a trigger circuit to generate a trigger signal based on a reset signal, the trigger circuit comprising a storage element to generate a control signal, the storage element being reset upon receiving the reset signal, and a gating circuit coupled to the storage element to gate the control signal, the gated control signal corresponding to the trigger signal;
    a controller coupled to the trigger circuit to control generation of an oscillator signal from a main oscillator based on the reset signal; and
    a stability generator coupled to the trigger circuit and the controller to generate a stability indicator signal in response to the trigger signal, the stability indicator signal indicating a stable condition of the main oscillator upon expiration of a start-up time of the main oscillator.

2. The apparatus of claim 1 wherein the storage element receives a command bit from a processor, the command bit being clocked into the storage element by the oscillator signal.

3. The apparatus of claim 1 wherein the controller comprises:
    a control circuit to generate the oscillator signal from the main oscillator upon receiving the stability indicator signal, the oscillator signal being reset by the reset signal.

4. The apparatus of claim 3 wherein the controller further comprises:
    a wake-up circuit to enable the stability generator upon receiving a wake-up signal, the wake-up circuit being reset by the reset signal.

5. The apparatus of claim 4 wherein the stability generator comprises:
    a ring oscillator to generate a ring oscillator signal upon receiving the trigger signal; and
    a counter clocked by the ring oscillator signal to generate the stability indicator signal when a maximum count is reached, the maximum count being selected to correspond to the start-up time, the counter being reset by the reset signal.

6. The apparatus of claim 5 wherein the counter is further reset by the wake-up circuit.

7. The apparatus of claim 6 wherein the counter is enabled by the wake-up circuit.

8. The apparatus of claim 5 wherein the ring oscillator comprises:
    a ring of circularly connected logic elements to generate the ring oscillator signal having a frequency range.

9. The apparatus of claim 5 wherein the maximum count is selected based on the frequency range.

10. A method comprising:
    generating a trigger signal based on a reset signal, generating the trigger signal comprising generating a control signal from a storage element, the storage element being reset upon receiving the reset signal, and gating the control signal, the gated control signal corresponding to the trigger signal;
    controlling generation of an oscillator signal from a main oscillator based on the reset signal; and
    generating a stability indicator signal in response to the trigger signal, the stability indicator signal indicating a stable condition of the main oscillator upon expiration of a start-up time of the main oscillator.

11. The method of claim 10 wherein generating the control signal comprises receiving a command bit from a processor, the command bit being clocked into the storage element by the oscillator signal.

12. The method of claim 10 wherein controlling generation of the oscillator signal comprises:
    generating the oscillator signal from the main oscillator upon receiving the stability indicator signal, the oscillator signal being reset by the reset signal.

13. The method of claim 12 wherein controlling generation of the oscillator signal further comprises:
    enabling the stability generator upon receiving a wake-up signal by a wake-up circuit, the wake-up circuit being reset by the reset signal.

14. The method of claim 12 wherein generating the stability indicator signal comprises:
    generating a ring oscillator signal upon receiving the trigger signal; and
    generating the stability indicator signal, by a counter clocked by the ring oscillator signal, when a maximum count is reached, the maximum count being selected to correspond to the start-up time, the counter being reset by the reset signal.

15. The method of claim 14 wherein the counter is further reset by the wake-up circuit.

16. The method of claim 15 wherein the counter is enabled by the wake-up circuit.

17. The method of claim 14 wherein generating the ring oscillator signal comprises,
    generating the ring oscillator signal having a frequency range by a ring of circularly connected logic elements.

18. The method of claim 14 wherein the maximum count is selected based on the frequency range.

19. A system comprising:
    a main oscillator;
    a power-on reset circuitry to generate a reset signal; and
    a oscillator activator coupled to the main oscillator, the oscillator activator comprising:
        a trigger circuit to generate a trigger signal based on the reset signal, the trigger circuit comprising a storage element to generate a control signal, the storage element being reset upon receiving the reset signal, and a gating circuit coupled to the storage element to gate the control signal, the gated control signal corresponding to the trigger signal;
        a controller coupled to the trigger circuit and the main oscillator to control generation of an oscillator signal from the main oscillator based on the reset signal; and
        a stability generator coupled to the trigger circuit and the controller to generate a stability indicator signal in response to the trigger signal, the stability indicator signal indicating a stable condition of the main oscillator upon expiration of a start-up time of the main oscillator.

20. The system of claim 19 wherein the storage element receives a command bit from a processor, the command bit being clocked into the storage element by the oscillator signal.

21. The system of claim 19 wherein the controller comprises:
    a control circuit to generate the oscillator signal from the main oscillator upon receiving the stability indicator signal, the control circuit being reset by the reset signal.

22. The system of claim 21 wherein the controller further comprises:
  a wake-up circuit to enable the stability generator upon receiving a wake-up signal, the wake-up circuit being reset by the reset signal.

23. The system of claim 21 wherein the stability generator comprises:
  a ring oscillator to generate a ring oscillator signal upon receiving the trigger signal; and
  a counter clocked by the ring oscillator signal to generate the stability indicator signal when a maximum count is reached, the maximum count being selected to correspond to the start-up time, the counter being reset by the reset signal.

24. The system of claim 23 wherein the counter is further reset by the wake-up circuit.

25. The system of claim 24 wherein the counter is enabled by the wake-up circuit.

26. The system of claim 23 wherein the ring oscillator comprises:
  a ring of circularly connected logic elements to generate the ring oscillator signal having a frequency range.

27. The system of claim 23 wherein the maximum count is selected based on the frequency range.

* * * * *